(12) United States Patent
Feng et al.

(10) Patent No.: US 12,057,694 B2
(45) Date of Patent: Aug. 6, 2024

(54) ELECTRONIC DEVICE

(71) Applicant: InnoLux Corporation, Chu-Nan (TW)

(72) Inventors: Yu-Hsin Feng, Chu-Nan (TW); Ching-Wen Shih, Chu-Nan (TW)

(73) Assignee: INNOLUX CORPORATION, Miao-Li County (TW)

( * ) Notice: Subject to any disclaimer, the term of this patent is extended or adjusted under 35 U.S.C. 154(b) by 521 days.

(21) Appl. No.: 17/499,907

(22) Filed: Oct. 13, 2021

(65) Prior Publication Data
US 2022/0158439 A1 May 19, 2022

(30) Foreign Application Priority Data
Nov. 16, 2020 (CN) .......................... 202011275369.5

(51) Int. Cl.
*H02H 3/093* (2006.01)

(52) U.S. Cl.
CPC ................................ *H02H 3/0935* (2013.01)

(58) Field of Classification Search
CPC ............ H02M 1/32; H02M 2001/322; H02M 2001/327; H02M 1/34; H02M 2001/342; H02M 2001/344; H02M 2001/346; H02M 2001/348; H02M 1/36; H02M 1/38; H02M 1/42; H02M 1/4208; H02M 1/4216; H02M 1/4225; H02M 1/4233; H02M 1/4241; H02M 1/425; H02M 1/4258; H02M 1/4266; H02M 2001/4275; H02M 2001/4283; H02M 2001/4291; H02H 3/0935; H02H 3/10; H02H 3/105; G09G 3/3275; G09G 3/325; G09G 3/3266; G09G 3/2383; G09G 2300/043; G09G 2320/0242;
(Continued)

(56) References Cited

U.S. PATENT DOCUMENTS 3,786,263 A * 1/1974 Michon ............. H01L 27/14862
257/236
7,952,343 B2 * 5/2011 Edwards .............. G01R 19/255
324/606
(Continued)

FOREIGN PATENT DOCUMENTS

CN 106297702 A 1/2017
JP 2013062976 A 4/2013

*Primary Examiner* — Thienvu V Tran
*Assistant Examiner* — Nusrat Quddus
(74) *Attorney, Agent, or Firm* — MUNCY, GEISSLER, OLDS & LOWE, P.C.

(57) ABSTRACT

An electronic device includes a substrate and a timing control module. The timing control module transmits a plurality of timing control signals to the substrate. The timing control module includes an overcurrent protection circuit for detecting the timing control signals. The overcurrent protection circuit includes a subtractor and a comparator electrically connected to the substractor. The timing control signals include a first timing control signal and a second timing control signal. The subtractor calculates a first current difference value between a draw current value of the first timing control signal and a draw current value of the second timing control signal. The comparator compares the first current difference value with a first threshold and, when the first current difference is greater than or equal to the first threshold value, the overcurrent protection circuit performs an overcurrent protection mechanism.

20 Claims, 6 Drawing Sheets

(58) Field of Classification Search
CPC ..... G09G 2320/029; G09G 2320/0233; G09G 2320/06; G09G 2320/0626; G09G 2310/0267; G09G 2310/0286; G09G 2310/0297
USPC ....... 345/173–178, 691, 204, 207, 208, 211; 361/93.1, 93.2, 93.9
See application file for complete search history.

(56) References Cited

U.S. PATENT DOCUMENTS

| | | | |
|---|---|---|---|
| 9,225,158 B2* | 12/2015 | Kawamoto | H02H 3/08 |
| 10,170,044 B2* | 1/2019 | Park | G09G 3/325 |
| 11,264,983 B1* | 3/2022 | Kaya | H03K 17/122 |
| 2006/0238943 A1* | 10/2006 | Awakura | G09G 3/3258 |
| | | | 361/93.1 |
| 2013/0063850 A1* | 3/2013 | Kawamoto | H02H 3/08 |
| | | | 361/87 |
| 2015/0022562 A1* | 1/2015 | Tsubakino | G09G 3/3275 |
| | | | 345/89 |
| 2016/0111868 A1* | 4/2016 | Kawata | H02H 3/10 |
| | | | 361/79 |
| 2016/0334831 A1* | 11/2016 | Mitsuishi | G06F 1/08 |
| 2019/0074766 A1* | 3/2019 | Villot | H02M 3/156 |

\* cited by examiner

ELECTRONIC DEVICE

CROSS REFERENCE TO RELATED APPLICATION

This application claims the benefits of the Chinese Patent Application Serial Number 202011275369.5, filed on Nov. 16, 2020, the subject matter of which is incorporated herein by reference.

BACKGROUND

1. Field of the Disclosure

The present disclosure relates to an electronic device and, more particularly, to an electronic device with an overcurrent protection circuit.

2. Description of Related Art

With the development of science and technology, the appearance design of electronic devices has become more exquisite. Taking a display device as an example, a borderless design is the current trend. In order to achieve a borderless design, the driving circuit of the display device is usually integrated with the display array directly on the same substrate, such as a gate on panel (GOP) design. However, in the manufacturing process of electronic devices, if there is foreign matter fallen on the lines of the driving circuit (such as GOP circuit) in the periphery area, damage caused by the manufacturing process, or electrostatic discharge effect (ESD), it may cause the lines of the driving circuit to encounter the problem of short circuit, resulting in generation of a large current in the periphery area that may cause part of the substrate to burn.

Therefore, there is a need for an electronic device with an overcurrent protection mechanism to solve the abovementioned problems.

SUMMARY

In one aspect, the present disclosure provides an electronic device, which is characterized in comprising: a substrate; and a timing control module transmitting a plurality of timing control signals to the substrate, and including an overcurrent protection circuit for detecting a draw current value of the plurality of timing control signals, wherein the overcurrent protection circuit includes a subtractor and a comparator, and the subtractor is electrically connected to the comparator; wherein the plurality of timing control signals include a first timing control signal and a second timing control signal, the subtractor calculates a first current difference value between the draw current value of the second timing control signal and the draw current value of the first timing control signal, the comparator compares the first current difference value with a first threshold value, and the overcurrent protection circuit performs an overcurrent protection mechanism when the first current difference value is greater than or equal to the first threshold value.

In another aspect, the present disclosure provides an electronic device, which is characterized in comprising: the present disclosure provides an electronic device, which is characterized in comprising: an electronic device, comprising: a substrate; and a timing control module transmitting a plurality of timing control signals to the substrate, and including an overcurrent protection circuit for detecting a draw current value of at least one timing control signal, wherein the overcurrent protection circuit includes a subtractor and a comparator, and the subtractor is electrically connected to the comparator; wherein the at least one timing control signal includes a plurality of periods, the at least one timing control signal has a draw current value at a specific time point in each period and there are a maximum value and a minimum value among the draw current values, the subtractor calculates a second current difference value between the maximum value and the minimum value, the comparator compares the second current difference value with a second threshold value, and the overcurrent protection circuit performs an overcurrent protection mechanism when the second current difference value is greater than or equal to the second threshold value.

Other novel features of the disclosure will become more apparent from the following detailed description when taken in conjunction with the accompanying drawings.

DETAILED DESCRIPTION OF EMBODIMENT

Figure 1:
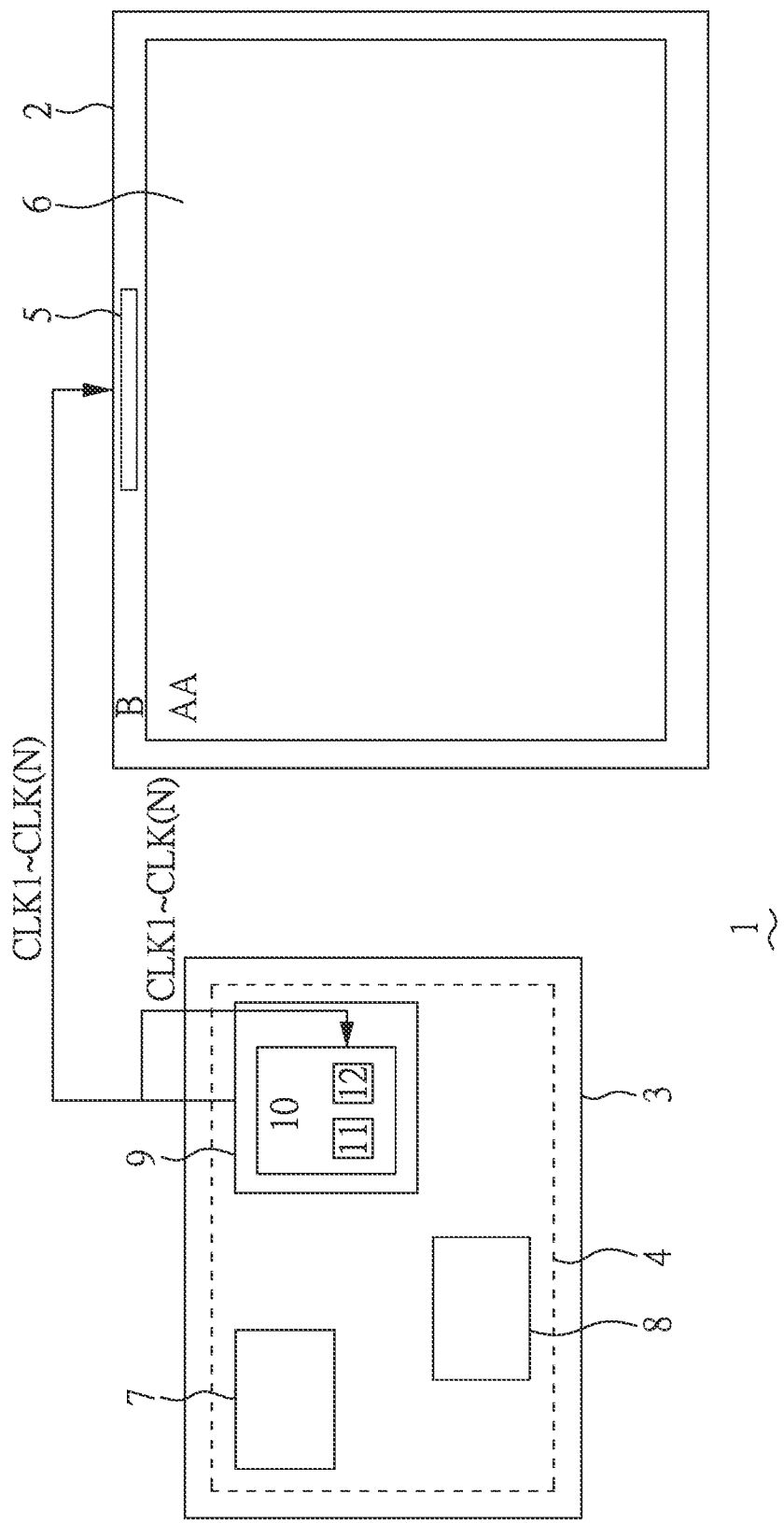
FIG. 1 is a schematic structure diagram of an electronic device according to an embodiment of the present disclosure.

When read in conjunction with the accompanying drawings, the following embodiments are used to clearly demonstrate the above and other technical content, features and/or effects of the present disclosure. Through the description of the specific embodiments, those skilled in the art will further understand the technical means and effects used in the present disclosure to achieve the aforementioned purpose. In addition, since the content disclosed in the present disclosure should be easy to understand and can be implemented by those skilled in the art, all equivalent replacements or modifications that do not depart from the concept of the present disclosure should be involved in the claims.

It should be noted that, in the specification and claims, unless otherwise specified, having "one" element is not limited to having a single said element, but one or more said elements may be provided.

In addition, in the specification and claims, unless otherwise specified, ordinal numbers, such as "first" and "second", used herein are intended to distinguish components rather than disclose explicitly or implicitly that names of the components bear the wording of the ordinal numbers. The ordinal numbers do not imply what order a component and another component are in terms of space, time or steps of a manufacturing method. A "first" element and a "second" element may appear together in the same component, or separately in different components. The existence of an element with a larger ordinal number does not necessarily mean the existence of another element with a smaller ordinal number.

In addition, the term "adjacent" in the specification and claims is used to describe mutual proximity, and does not necessarily mean mutual contact.

In addition, the description of "when . . . " or "while . . . " in the present disclosure means "now, before, or after", etc., and is not limited to occurrence at the same time. In the present disclosure, the similar description of "disposed on" or the like refers to the corresponding positional relationship between the two elements, and does not limit whether there is contact between the two elements, unless specifically limited. Furthermore, when the present disclosure recites multiple effects, if the word "or" is used between the effects, it means that the effects can exist independently, but it does not exclude that multiple effects can exist at the same time.

In addition, the term "connect" or "couple" is intended not only directly connect with other element, but also intended indirectly connect and electrically connect with other element.

In addition, in the specification and claims, the terms "almost", "about", "approximately" or "substantially" usually means within 10%, 5%, 3%, 2%, 1% or 0.5% of a given value or range. The quantity given here is an approximate quantity; that is, without specifying "almost", "about", "approximately" or "substantially", it can still imply the meaning of "almost", "about", "approximately" or "substantially". In addition, the term "range of the first value to the second value" or "range between the first value and the second value" indicates that the range includes the first value, the second value, and other values in between.

In addition, the technical features of the different embodiments disclosed in the present disclosure can be combined to form another embodiment.

In addition, the electronic device disclosed in the present disclosure may include a display device, an antenna device, a sensing device, a touch display device, a curved display device, or a flee shape display device, but is not limited thereto. The electronic device may be a bendable or flexible electronic device. The electronic device may include, for example, liquid crystal, light emitting diode, fluorescence, phosphor, other suitable display media, or a combination thereof, but is not limited thereto. The light emitting diode may include, for example, an organic light emitting diode (OLED), a sub-millimeter light emitting diode (mini LED), a micro light emitting diode (micro LED) or a quantum dot (QD) light emitting diode (for example, QLED, QDLED) or other suitable materials or a combination thereof, but is not limited thereto. The display device may include, for example, a tiled display device, but is not limited thereto. The antenna device may be, for example, a liquid crystal antenna, but is not limited thereto. The antenna device may include, for example, a tiled antenna device, but is not limited thereto. It should be noted that the electronic device may be a combination of the foregoing, but is not limited thereto. In addition, the appearance of the electronic device may be rectangular, circular, polygonal, a shape with curved edges, or other suitable shapes. The electronic device may have peripheral systems such as a driving system, a control system, a light source system, a shelf system, etc., to support a display device, an antenna device, or a tiled device. Hereinafter, the display device will be used as an electronic device for illustrative purpose only, but the disclosure is not limited thereto.

For the convenience of description, the following paragraphs will be given with the electronic device as the display device, but the present disclosure is not limited to this.

FIG. 1 is a schematic structure diagram of an electronic device 1 according to an embodiment of the present disclosure. As shown in FIG. 1, the electronic device 1 includes: a substrate 2, a circuit board 3, and a timing control module 4, wherein the timing control module 4 is disposed on the circuit board 3, and the timing control module 4 includes an overcurrent protection circuit 10. The substrate 2 is electrically connected to the circuit board 3. When the electronic device 1 is a display device, the substrate 2 may be a display array substrate, and the circuit board 3 may be provided with a control circuit of the display array substrate, but it is not limited thereto. The timing control module 4 may transmit a plurality of timing control signals CLK1~CLK(N) to the substrate 2, where N is a positive integer greater than or equal to 2. In one embodiment, the timing control signals CLK1~CLK(N) can be respectively transmitted through different lines. The overcurrent protection circuit 10 is provided to detect the magnitude of the current of the timing control signal CLK1~CLK(N) transmitted by the timing control module 4, and includes a subtractor 11 and a comparator 12.

At least one feature of the present disclosure is that: the overcurrent protection circuit 10 may perform a first detection mechanism or a second detection mechanism on the timing control signals CLK1~CLK(N) through the subtractor 11 and the comparator 12, and determine whether to perform an overcurrent protection mechanism. The aspect of the overcurrent protection mechanism includes but is not limited to: stopping the timing control module 4 from transmitting the timing control signals CLK1~CLK(N) to the substrate 2.

In order to clearly explain the present disclosure, the timing control signals CLK1~CLK(N) will be described first, and the details of various components will be described in subsequent paragraphs.

Figure 2:
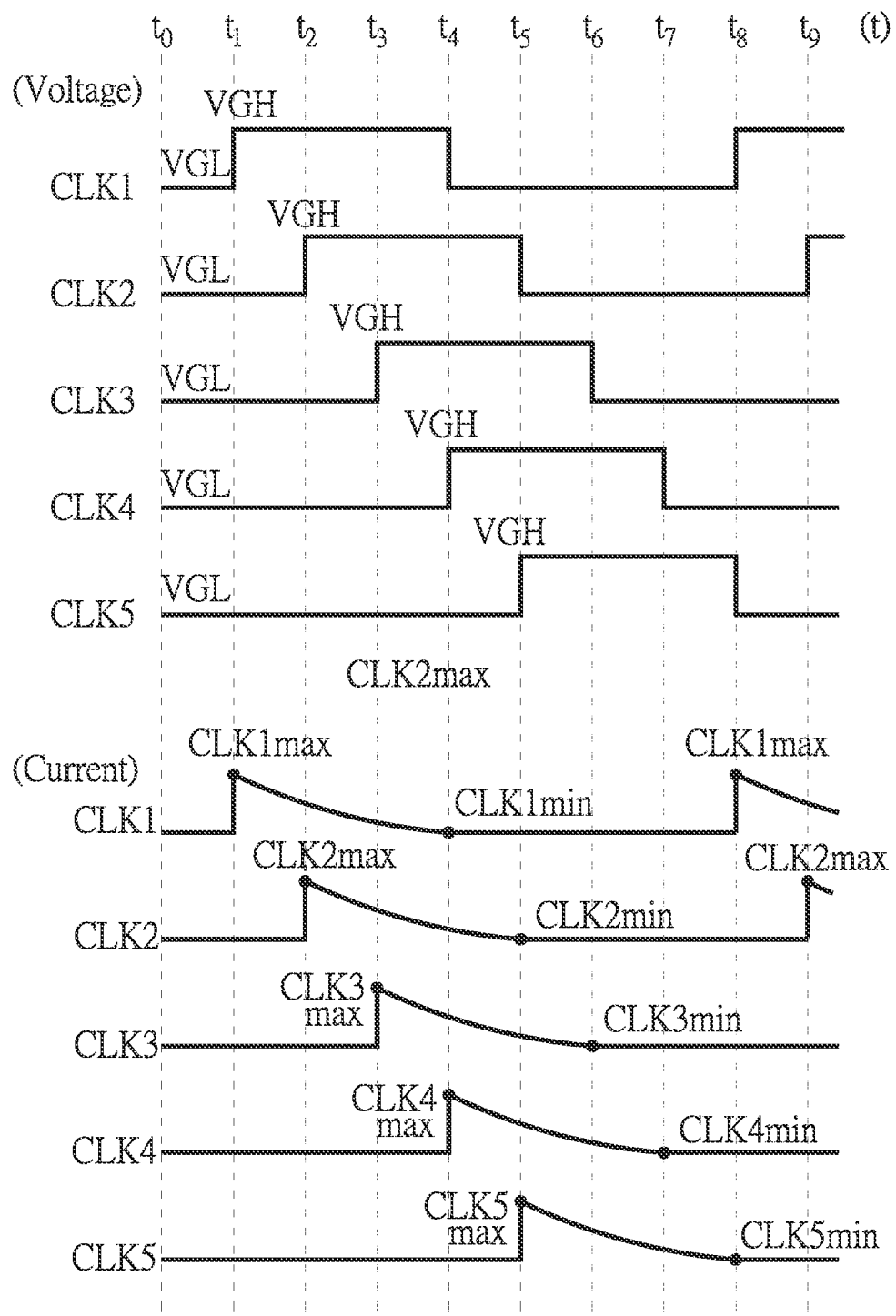
FIG. 2 is a timing diagram of the timing control signals according to an embodiment of the present disclosure.

FIG. 2, is a timing diagram of the timing control signals CLK1~CLK(N) according to an embodiment of the present disclosure. For the convenience of description, N=5 is taken as an example, that is, the timing control signals CLK1~CLK(N) include a first timing control signal CLK1, a second timing control signal CLK2, a third timing control signal CLK3, a fourth timing control signal CLK4, and a fifth timing control signal CLK5. In addition, FIG. 2 corresponds to a timing during an operation period of the electronic device 1 (for example, a frame display period), wherein the horizontal axis of the timing diagram is a time axis (t), and the vertical axis represents voltage or current, where the time axis (t) includes a plurality of time points, such as t1~t9, and there is the same interval between every two adjacent time points. Furthermore, the numbers from the first timing control signal CLK1 to the Nth timing control signal CLK(N) in the present disclosure are arranged according to timing. That is, for the embodiment of FIG. 2, the first timing control signal CLK1 has a high-voltage period that occurs earliest (the duration of VGH, corresponding to time points t1 to t4), and the fifth timing control signal CLK5 has a high-voltage period that occurs latest (the duration of VGH, corresponding to time points t5 to t8). In addition, the timings of the high-voltage periods between every two adjacent timing control signals (such as CLK1 and CLK2, CLK2 and CLK3, CLK3 and CLK4, CLK4 and CLK5) have the same time interval, such as one time interval (interval between two adjacent time points), but it is not limited thereto.

As shown in FIG. 2, the timing control signals CLK1~CLK5 may provide a basic current (for example, current value of 0) during the low voltage period (the duration of VGL), and the timing control signals CLK1~CLK5 may provide a current with a current value different from that of the basic current (hereinafter referred to as a draw current) during the high voltage period (the duration of VGH). The draw current value of the draw current may change with time, so as to have a maximum draw current value and a minimum draw current value. In this embodiment, the maximum draw current value corresponds to the starting time point of the high voltage period and, under normal circumstances, the draw current value will decrease to the minimum current value as time passes. For example, the starting time point (e.g., t1 or t8 in FIG. 2) of the first timing control signal CLK1 during the high voltage period (VGH) has the maximum draw current value CLK1max, and the draw current decreases to the minimum current value CLK1min (e.g., to the basic current) as time passes. In addition, the high voltage periods (VGH) of the timing control signals CLK1~CLK5 all provide the same voltage waveform (for example, square wave signals of the same size), so that the draw currents of the timing control signals CLK1 to CLK5 also have the same waveform.

It is noted that the example in the present disclosure is based on the case where the timing control signals CLK1~CLK5 provide positive voltage during the high voltage period. However, those skilled in the art is can infer the case where the timing control signals CLK1~CLK5 provide negative voltage during the high voltage period.

The first detection mechanism or the second detection mechanism of the present disclosure may detect the draw current values of the timing control signals CLK1 to CLK5, so as to reduce the probability of substrate burnout due to a short circuit.

The first detection mechanism of the present disclosure is as follows: the subtractor 11 calculates a current difference value (hereinafter referred to as the first current difference value) between the draw current values of one of the timing control signals CLK1~CLK5 and another timing control signal, wherein the one of the timing control signals and the another timing control signal are two timing control signals that are adjacent in timing (such as CLK1 and CLK2). For convenience of description, the first timing control signal CLK1 and the second timing control signal CLK2 are used as examples in the following description. The first timing control signal CLK1 has a maximum draw current value (CLK1max) at the first time point (for example, t1), and the second timing control signal CLK2 has a maximum draw current value (CLK2max) at the second time point (for example, t2). Therefore, the first current difference value can be the current difference value between the maximum draw current value (CLK2max) of the second timing control signal CLK2 and the maximum draw current value (CLK1max) of the first timing control signal CLK1. Then, by using the comparator 12 to compare the first current difference value (for example, CLK2max−CLK1max) with a first threshold value T1 (marked in FIG. 3), when the first current difference value (CLK2max−CLK1max) is greater than or equal to the first threshold value T1, the overcurrent protection circuit 10 executes the overcurrent protection mechanism.

It is noted that, although in this embodiment, the first current difference value (for example, CLK2max−CLK1max) is obtained by subtracting the maximum draw current value (for example, CLK1max) of the earlier timing control signal (for example, CLK1) from the maximum draw current value (for example, CLK2max) of the later timing control signal (for example, CLK2). However, in other embodiments, the first current difference value may be obtained in an opposite manner (e.g. CLK1max−CLK2max), but it is not limited thereto.

In one embodiment, the overcurrent protection circuit 10 may be set to perform an overcurrent protection mechanism as long as any first current difference value (such as CLK2max−CLK1max, CLK3max−CLK2max, . . . , CLK5max−CLK4max) is greater than or equal to the first threshold value T1, but it is not limited thereto.

In addition, in one embodiment, the timing control signals (CLK1~CLK5) include the last timing control signal, such as the fifth timing control signal CLK5, which has the maximum draw current value (CLK5max) at a fifth time point (for example, t5) after the second time point (for example, t2). In one embodiment, the subtractor 11 may calculate the current difference value (for example, CLK1max−CLK5max) between the draw current values of the first timing control signal (for example, CLK1) and the fifth timing control signal (for example, CLK5), and the comparator 12 may compare the current difference value (for example, CLK1max−CLK5max) with a first threshold value (T1). When the current difference value (for example, CLK1max−CLK5max) is greater than or equal to the first threshold T1, the overcurrent protection circuit 10 also performs an overcurrent protection mechanism.

In one embodiment, the first threshold value T1 may be between 5 and 250 milliamps (5 mA≤T1≤250 mA). In one embodiment, the first threshold value may be between 10 and 250 milliamps (10 mA≤T1≤250 mA). In one embodiment, the first threshold value may be between 10 and 200 milliamps (10 mA≤T1≤200 mA). In one embodiment, the first threshold value may be between 10 and 150 milliamps (10 mA≤T1≤150 mA). In one embodiment, the first threshold value may be between 10 and 100 milliamps (10 mA≤T1≤100 mA). In one embodiment, the first threshold value may be between 15 and 100 milliamps (15 mA≤T1≤100 mA). In one embodiment, the first threshold value may be between 20 and 50 milliamps (20 mA≤T≤50 mA). However, the present disclosure is not limited to this.

Next, with reference to FIG. 1 and FIG. 2 again, the details of the substrate 2, the circuit board 3 and the timing control module 4 will be described as follows.

First, the details of the substrate 2 will be described. In addition to being used for a display device, the substrate 2 may also be used for an antenna device, a sensing device, a tilted device, etc., and is not limited thereto, in one embodiment, an active device may be provided on the substrate 2, and the active device may include a transistor. The substrate 2 includes a flexible substrate or a non-flexible substrate, and its material may include, for example, glass, quartz, wafer, sapphire substrate, polycarbonate (PC), polyimide (PI), polypropylene (PP), polyethylene terephthalate (PET), other suitable materials, or a combination of the above materials, but the present disclosure is not limited thereto.

In addition, when the electronic device 1 is a display device, the substrate 2 may be a display array substrate. The substrate 2 may include a display area (AA) and a non-display area (B), wherein the non-display area (B) is arranged beside the display area (AA), and the non-display area (B) is electrically connected to the timing control module 4. In one embodiment, the non-display area (B) may include at least one driving circuit 5, such as a gate driving circuit, a source driving circuit, etc., and is not limited thereto. In one embodiment, the display area (AA) may include a display array 6, wherein the driving circuit 5 is electrically connected to the display array 6. In one embodiment, the driving circuit 5 includes a gate on panel circuit (GOP circuit). The GOP circuit receives the timing control signals CLK1~CLK(N) from the timing control module 4, and generates a plurality of gate signals according to the timing control signals CLK1~CLK(N). In one embodiment, the display array 6 may include a plurality of scan lines (not shown), and each timing control signal CLK1~CLK(N) may correspond to a single or a plurality of scan lines.

Next, the details of the circuit board 3 will be described. The circuit board 3 is provided outside the substrate 2. A plurality of electronic components may be arranged on the circuit board 3, and the electronic components may form various electronic circuits, such as the timing control module 4, but is not limited thereto. In one embodiment, the circuit board 3 may be a printed circuit board (PCB), a flexible printed circuit (FPC), etc., and is not limited thereto.

Next, the details of the timing control module 4 will be described. In one embodiment, the timing control module 4 may include a pulse width modulator (PWM) 7, a timing controller (TCON) 8, and a level shifter (LS) 9. The pulse width modulator 7 is electrically connected to the timing controller 8, and the timing controller is electrically connected to the level shifter 9. The overcurrent protection circuit 10 may be provided in the level shifter 9, but may also be an independent component. In one embodiment, each of the pulse width modulator 7, the timing controller 8 and the level shifter 9 may be implemented in an electronic circuit. However, in another embodiment, if the circuit board 3 has a processor, the pulse width modulator 7, the timing controller 8 or the level shifter 9 may also be implemented by software or firmware. In one embodiment, the pulse width modulator 7 may provide an initial voltage to the timing controller 8. The timing controller 8 may use the initial voltage to generate timing control signals CLK1~CLK(N). The level shifter 9 may adjust the voltage levels of the timing control signals CLK1~CLK(N), and transmit the adjusted timing control signals CLK1~CLK(N) to the substrate 2. In one embodiment, the level shifter 9 may simultaneously transmit the timing control signals CLK1~CLK(N) to the overcurrent protection circuit 10.

In addition, in one embodiment, the overcurrent protection circuit 10 may be electrically connected to the pulse width modulator 7 or the timing controller 8 (at least one), such that, when the overcurrent protection circuit 10 performs an overcurrent protection mechanism, the overcurrent protection circuit 10 may transmit a control signal to the pulse width modulator 7, the timing controller 8 or the level shifter 9 to stop the operation of the pulse width modulator 7, the timing controller 8 or the level shifter, but it is not limited thereto. When the pulse width modulator 7, the timing controller 8 or the level shifter 9 is an electronic circuit, the aforementioned mechanism may be realized at least by configuring a switch component (for example, a transistor) in the pulse width modulator 7, the timing controller 8 or the level shifter 9, but it is not limited thereto.

Next, with reference to FIGS. 1 to 3 at the same time, the circuit structure and circuit operation mode of the overcurrent protection circuit 10 will be described with an embodiment and, for convenience of description, N=5 is taken as an example. It is noted that the circuit structure and circuit operation mode of the present disclosure may not be limited to the following content.

Figure 3:
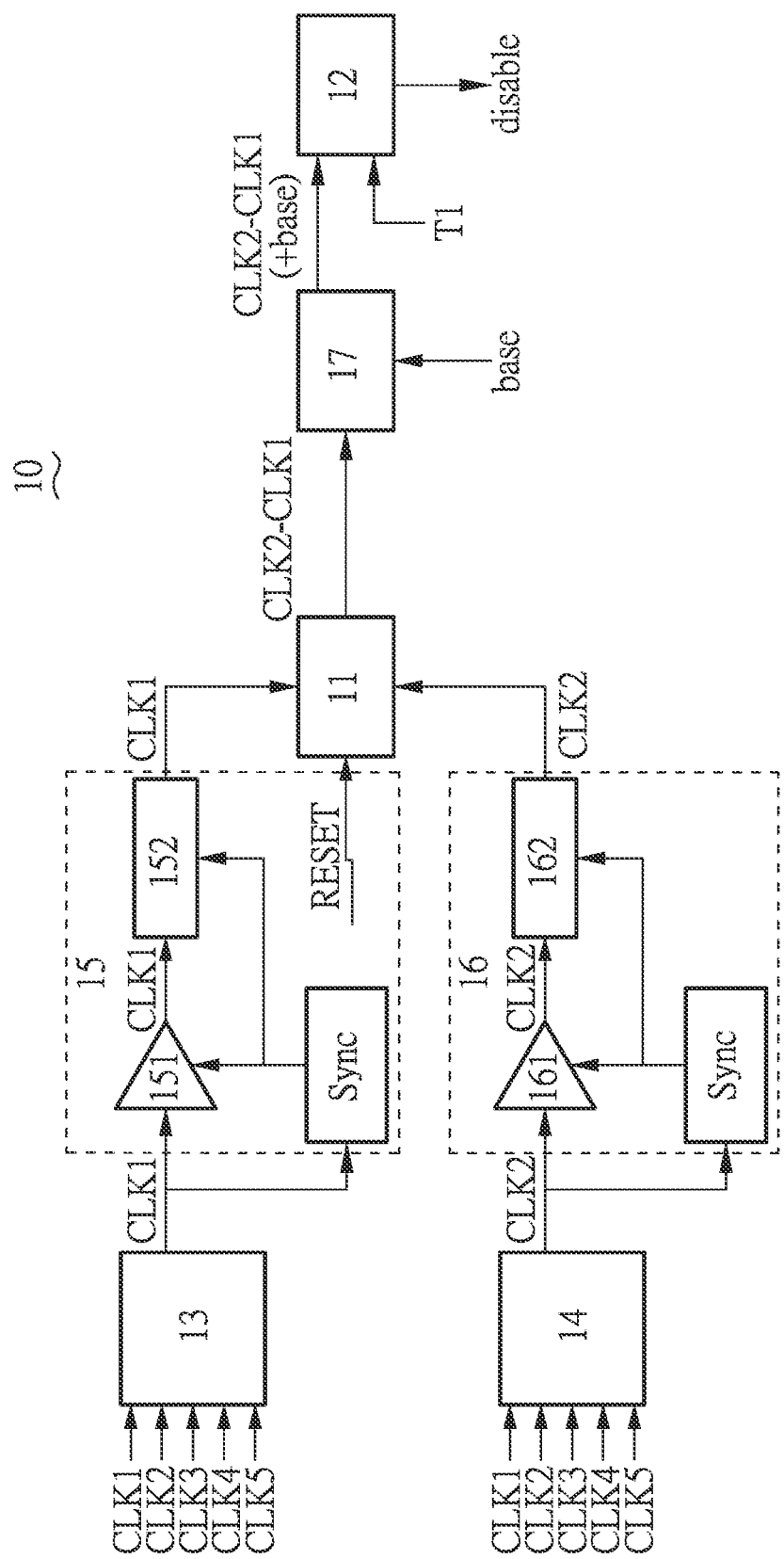
FIG. 3 is a circuit diagram of an overcurrent protection circuit according to an embodiment of the present disclosure.

FIG. 3 is a circuit structure diagram of an overcurrent protection circuit 10 according to an embodiment of the present disclosure, which is suitable for (but not limited to) the first detection mechanism. As shown in FIG. 3, the overcurrent protection circuit 10 suitable for the first detection mechanism may include a subtractor 11, a comparator 12, a first multiplexer 13, a second multiplexer 14, a first sampling circuit 15 and a second sampling circuit 16, wherein the first multiplexer 13 is electrically connected to the first sampling circuit 15, the first sampling circuit 15 is electrically connected to the subtractor 11, the second multiplexer 14 is electrically connected to the second sampling circuit 16, the second sampling circuit 16 is electrically connected to the subtractor 11, and the subtractor 11 is electrically connected to the comparator 12.

First, the details of the first multiplexer 13 and the second multiplexer 14 will be described. In one embodiment, the first multiplexer 13 may include a plurality of input terminals (for example, at least 5) to receive the timing control signals CLK1~CLK5 (for example, simultaneous reception or sequential reception) transmitted by the level shifter 9. The first multiplexer 13 may include an output terminal to output one of the timing control signals CLK1~CLK5. The second multiplexer 14 also includes a plurality of input terminals (for example, at least 5) to receive the timing control signals CLK1~CLK5 transmitted by the level shifter 9. The second multiplexer 14 also includes an output terminal to output one of the timing control signals CLK1~CLK(N). In other words, the overcurrent protection circuit 10 may receive the timing control signals transmitted by the level shifter 9 through the first multiplexer 13 and the second multiplexer 14.

In one embodiment, switch components (not shown) may be provided inside the first multiplexer 13 and the second multiplexer 14, so that the first multiplexer 13 and the second multiplexer 14 may select the timing control signal for output for each time through switching the switch components, but it is not limited thereto. In addition, when the first multiplexer 13 outputs a timing control signal (for example, outputting the first timing control signal CLK1), the second multiplexer 14 is configured to output another timing control signal (for example, outputting the second timing control signal CLK2).

Next, the details of the first sampling circuit 15 and the second sampling circuit 16 will be described. In one embodiment, the first sampling circuit (15) is arranged between the first multiplexer (13) and the subtractor (11), and the second sampling circuit (16) is arranged between the second multiplexer (14) and the subtractor (11). The first sampling circuit 15 may include a first sampler 151 and a first register 152, wherein the first sampler 151 is disposed between the first multiplexer 13 and the first register 152. The second sampling circuit 16 may include a second sampler 161 and a second register 162, wherein the second sampler 161 is disposed between the second multiplexer 14 and the second register 162. In one embodiment, the first sampling circuit 15 may use the first sampler 151 to perform sampling on the first timing control signal CLK1 starting from the first time point (for example, t1) corresponding to the maximum draw current value CLK1max of the draw current of the first timing control signal CLK1, and the second sampling circuit 15 may use the first sampler 161 to perform sampling on the second timing control signal CLK2 starting from the second time point (for example, t2) corresponding to the maximum draw current value CLK2max of the draw current of the second timing control signal CLK2, but it is not limited thereto.

From the timing diagram of FIG. 2, it can be seen that the time point of the draw current of each timing control signal CLK1~CLK5 is different. Therefore, if the first current difference value is to be calculated (taking the first timing control signal CLK1 and the second timing control signal CLK2 as an example), the time points of the maximum draw current values (for example, CLK1max and CLK2min) of the two timing control signals (CLK1 and CLK2) have to be aligned so as to calculate the first current difference value.

In this regard, in one embodiment, the first sampler 151 may be configured to perform sampling on the first timing control signal CLK1 starting from the first time point (for example, t1) corresponding to the maximum draw current value CLK1max of the draw current of the first timing control signal CLK1 so as to obtain one or more draw current values of the draw current of the first timing control signal CLK1. In one embodiment, the second sampler 161 may be configured to perform sampling on the second timing control signal CLK2 starting from the second time point (for example, t2) corresponding to the maximum draw current value CLK2max of the second timing control signal CLK2 so as to obtain one or more draw current values of the draw current of the second timing control signal CLK2, wherein the first time point (for example, t1) is earlier than the second time point (for example, t2). In one embodiment, the first sampler 151 and the second sampler 161 may each configure the time point for sampling based on a synchronization trigger signal (sync). As a result, the sampled first timing control signal CLK1 and second timing control signal CLK2 can be aligned.

Next, the first sampler 151 stores the sampled draw current value of the first timing control signal CLK1 in the first register 152, and the first register 152 transmits the draw current value of the first timing control signal CLK1 to the subtractor 11. Similarly, the second sampler 161 stores the sampled draw current value of the second timing control signal CLK2 in the second register 162, and the second register 162 transmits the draw current value of the second timing control signal CLK2 to the subtractor 11.

Next, the subtractor 11 will be described. In one embodiment, the subtractor 11 may perform a difference calculation on the draw current value of the first timing control signal CLK1 and the draw current value of the second timing control signal CLK2 so as to obtain a first current difference value (for example, CLK2max−CLK1max) between the second timing control signal CLK2 and the first timing control signal CLK2, and transmit the first current difference value (for example, CLK2max−CLK1max) to the comparator 12. In one embodiment, the first current difference value may be obtained, for example, by performing a subtraction on the current values of the two timing control signals (CLK1 and CLK2) that are aligned at the same time point (for example, the aligned CLK1max and CLK2max). Alternatively, it may also be obtained by performing subtractions on the draw current values at a plurality of time points after alignment to have a plurality of difference values, and then averaging the plurality of difference values. In addition, in one embodiment, the subtractor 11 may receive a reset signal (RESET) to perform resetting after each subtraction, but it is not limited thereto.

Next, the comparator 12 will be described. In one embodiment, the comparator 12 may include two input terminals and one output terminal, in which one of the input terminals may receive the first current difference value (for example, CLK2max−CLK1max) and the other input terminal may receive the first threshold value T1, and compare the first current difference value (for example, CLK2max−CLK1max) with the first threshold value T1. According to the comparison result, the comparator 12 may output a control signal (disable) to the pulse width modulator 7, the timing controller 8 or the level shifter 9, so as to control the operation of the pulse width modulator 7, the timing controller 8 or the level shifter 9. As a result, for example, when the wire of the second timing control signal CLK2 is short-circuited, the draw current value of the second timing control signal CLK2 will be higher than the draw current value under the normal situation (as shown in FIG. 2). At this moment, the overcurrent protection circuit 10 may perform an overcurrent protection mechanism based on the result that the first current difference value (CLK2max−CLK1max) is greater than or equal to the first threshold T1 (other timing control signals can be deduced in a similar way), so as to stop the electronic device 1 from operating thereby preventing burnout due to short circuit.

In addition, in one embodiment, the overcurrent protection circuit 10 may further include an adder 17 disposed between the subtractor 11 and the comparator 12. The adder 17 may add a predetermined base value (base) to the first current difference value (for example, CLK2max−CLK1max), so that the value inputted to the comparator 12 will be CLK2max−CLK1max+base, which is advantageous in that the configuration of the first threshold value T1 is more flexible. For example, through the present disclosure, it can reduce the influence of the electronic device on the judgment of the protection current due to the process variation or the environmental temperature change in use.

As a result, the overcurrent protection circuit 10 of this embodiment is able to implement the first detection mechanism.

Figure 4:
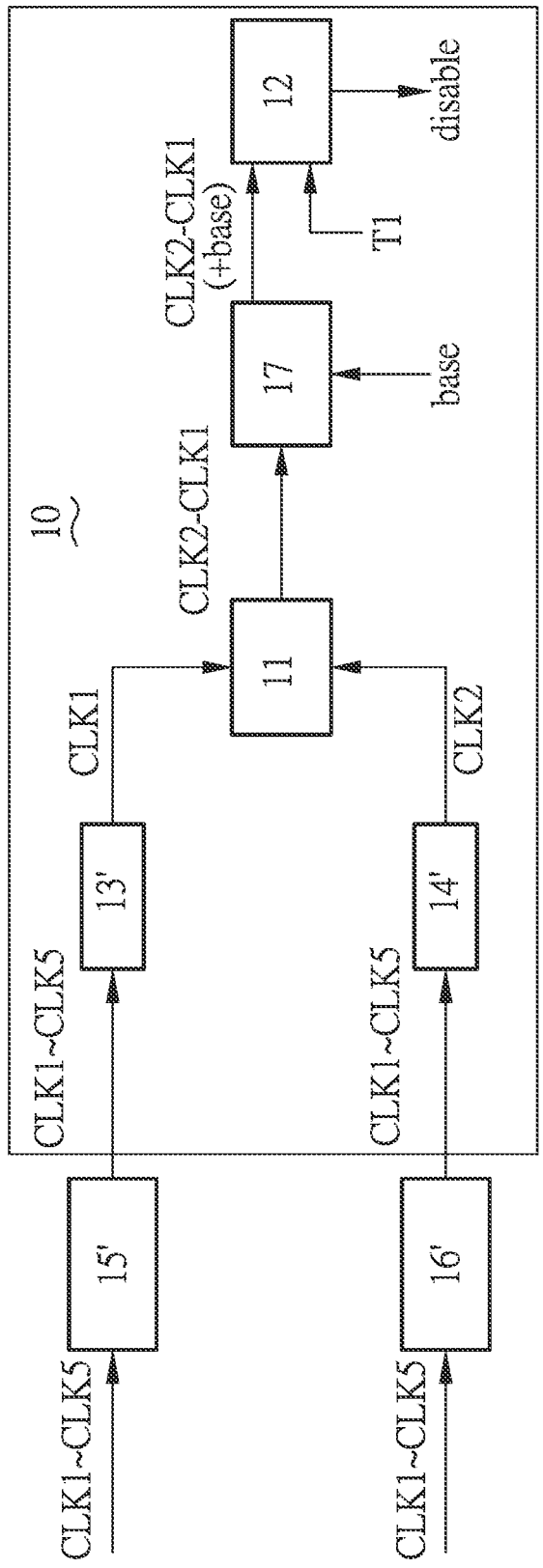
FIG. 4 is a circuit diagram of an overcurrent protection circuit according to another embodiment of the present disclosure.

In addition, the overcurrent protection circuit 10 may be implemented in different manners, FIG. 4 is a circuit structure diagram of an overcurrent protection circuit 10 according to another embodiment of the present disclosure, which is also suitable for (but not limited to) the first detection mechanism. Please refer to FIG. 1 to FIG. 4 at the same time and, for convenience of description, N=5 is taken as an example.

The embodiment of FIG. 4 is similar to that of FIG. 3 except that, in the embodiment of FIG. 3, the first multiplexer 13 and the second multiplexer 14 will obtain the timing control signals CLK1~CLK5 in advance, and output one of them to the first sampling circuit 15 and the second sampling circuit 16 for performing sampling and, in the embodiment of FIG. 4, a third sampling circuit 15' and a fourth sampling circuit 16' are first used to perform sampling on a plurality of timing control signals CLK1~CLK5, and then transmit the sampled timing control signals CLK1~CLK5 to a third multiplexer 13' and a fourth multiplexer 14', so that the third multiplexer 13' and the fourth multiplexer 14' may directly transmit one of the timing control signals CLK1 to CLK5 to the subtractor 11. In other words, the third sampling circuit 15' and the fourth sampling circuit 16' of the embodiment of FIG. 4 may be moved out of the overcurrent protection circuit 10, whereby the number of components of the overcurrent protection circuit 10 can be reduced.

Figure 5A:
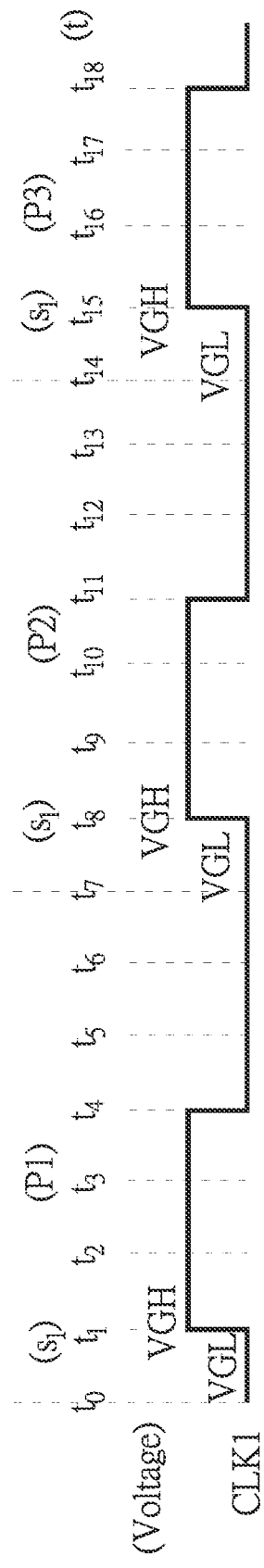
FIG. 5(A) is a first schematic diagram illustrating the timing of the timing control signal according to another embodiment of the present disclosure.
Figure 5B:
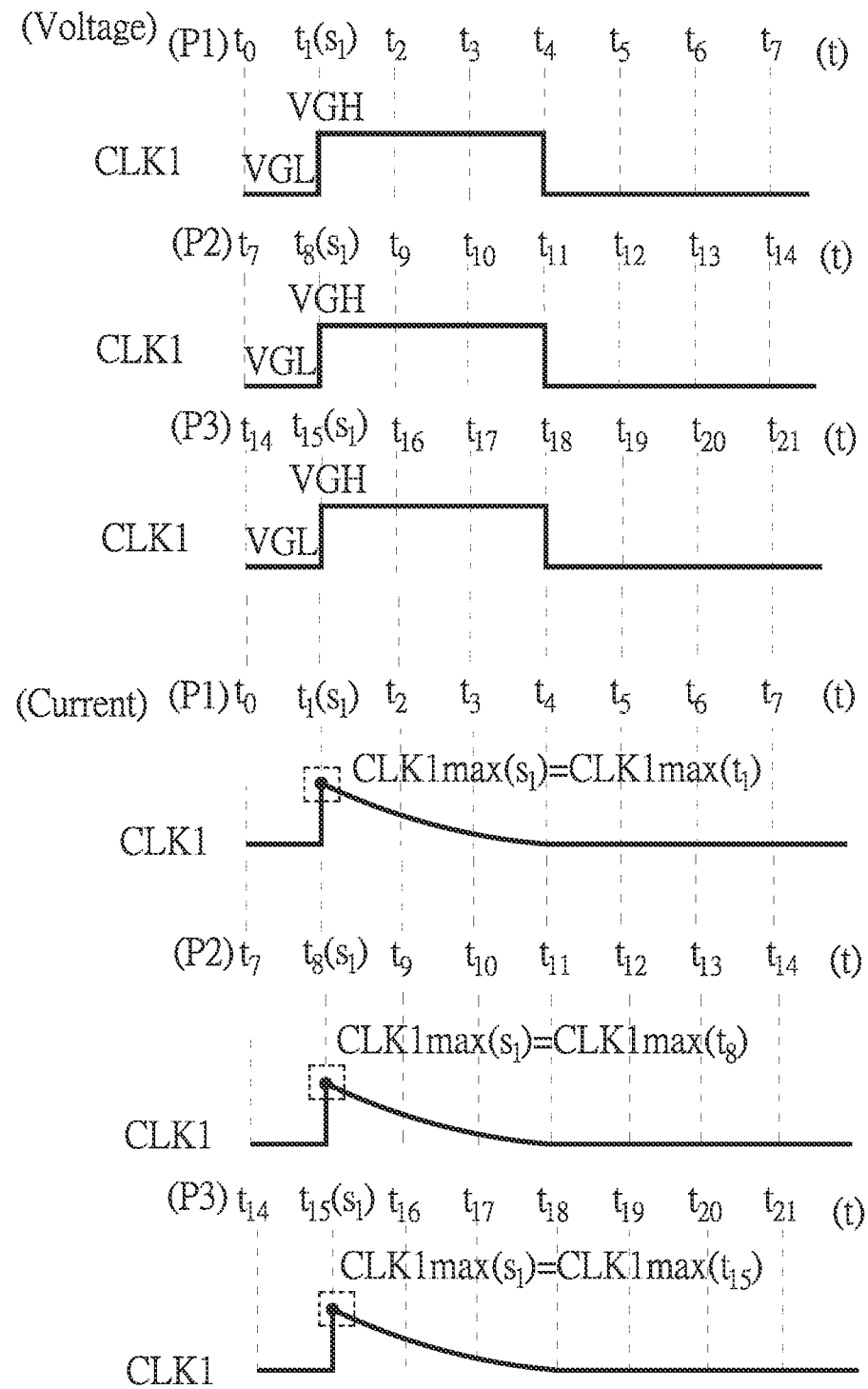
FIG. 5(B) is a second schematic diagram of the timing of FIG. 5(A)
Figure 5C:
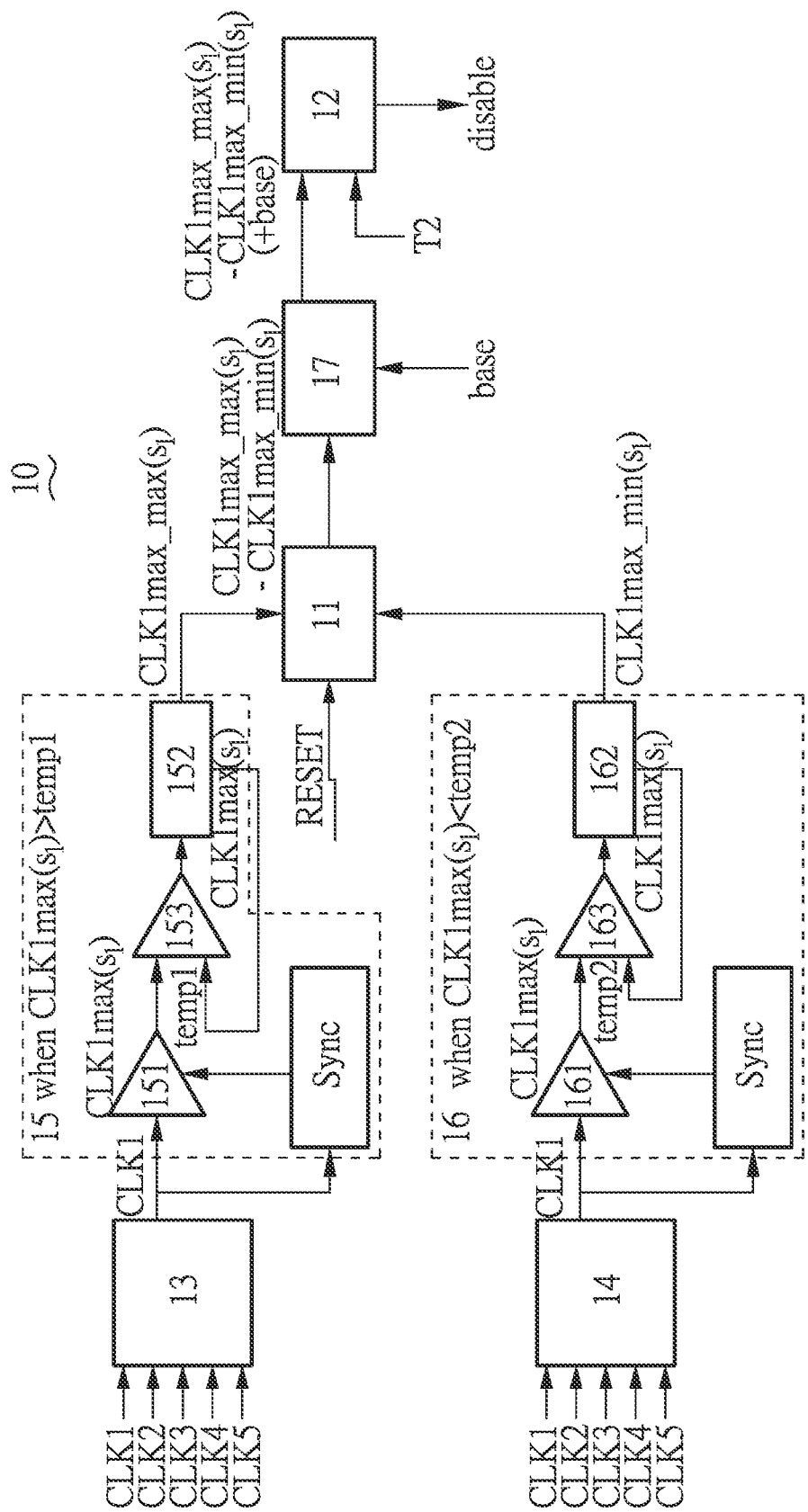
FIG. 5(C) is a circuit diagram of an overcurrent protection circuit according to another embodiment of the present disclosure.

Next, the second detection mechanism of the present disclosure will be described. Please refer to FIGS. 5(A)~5(C) at the same time. FIG. 5(A) is a first schematic diagram illustrating the timing of the timing control signal (for example, the first timing control signal CLK1) according to another embodiment of the present disclosure, which shows the continuous state of the timing of the first timing control signal CLK1. FIG. 5(B) is a second schematic diagram of the timing of FIG. 5(A), which is based on the corresponding relationship of the time points to show the draw current values of the first timing control signal CLK1 in the periods P1~P3, respectively. FIG. 5(C) is a circuit diagram of an overcurrent protection circuit according to another embodiment of the present disclosure, which is suitable for the second detection mechanism (but also suitable for the first detection mechanism), and N=5 is taken as an example for the convenience of description.

The second detection mechanism of the present disclosure is as follows: the overcurrent detection circuit 10 detects the draw current value of one of the timing control signals at a specific time point S1 in each period, and compares the difference value between a maximum value and a minimum value in the draw current value at a specific time point S1 of each period with a second threshold value T2, so as to determine whether a short circuit occurs. In the following, an example is described in which the first timing control signal CLK1 is detected, and the specific time point S1 is the time point at which the draw current value is maximum in the period.

As shown in FIG. 5(A), the first timing control signal CLK1 may include a plurality of periods, such as a first period P1, a second period P2 and a third period P3. The first timing control signal CLK1 has the maximum draw current value CLK1max(t1) in the first period P1 at the time point t1 of the high voltage period (VGH) of the first period P1. The first timing control signal CLK1 has the maximum draw current value CLK1max(t8) in the second period P2 at the time point t8 of the high voltage period (VGH) of the second period P2. The first timing control signal CLK1 has the maximum draw current value CLK1max(t15) in the third period P3 at the time point t15 of the high voltage period (VGH) of the third period P3. In other words, when the time points t1, t8 and t15 are used as the specific time points S1 of the periods P1~P3, the draw current values CLK1max (S1) of the first timing control signal CLK1 at the specific time points S1 of the periods P1~P3 are the maximum draw current values CLK1max (t1), CLK1max (t8) and CLK1max (t15), respectively. In one embodiment, the maximum draw current values CLK1max (t1), CLK1max (t8) and CLK1max (t15) may be the same, not completely the same, or different from each other.

In one embodiment, the overcurrent detection circuit 10 may find out, from the draw current values (for example, CLK1max(t1), CLK1max(t8) and CLK1max(t15)) of the first timing control signal CLK1 at the specific time points S1 (t1, t8 and t15) of the periods P1~P3, the maximum value (defined as CLK1max_max(S1) marked in FIG. 5(C)), and the minimum value (defined as CLK1max_min(S1) marked in FIG. 5(C)), and calculate a current difference value between the maximum value and the minimum value (defined as CLK1max_max(S1)−CLK1max_min(S1), marked in FIG. 5(C), hereinafter referred to as second current difference value). Then, the overcurrent protection circuit 10 may compare the second current difference value CLK1max_max(S1)−CLK1max_min(S11) with a second threshold value T2 (marked in FIG. 5(C)). When the second current difference value CLK1max_max(S1)−CLK1max_min(S1) is greater than or equal to the second threshold value T2, the overcurrent protection circuit 10 may perform an overcurrent protection mechanism.

In one embodiment, the overcurrent protection circuit 10 may be configured to perform the current protection mechanism as long as detecting that the second current difference value of any timing control signal (such as CLK1~CLK5) is greater than or equal to the second threshold value, but it is not limited thereto.

In one embodiment, the second threshold value 12 may be between 5 and 250 milliamps (5 mA≤T2≤250 mA). In one embodiment, the second threshold value may be between 10 and 250 milliamps (10 mA≤T2≤250 mA). In one embodiment, the second threshold value may be between 10 and 200 milliamps (10 mA≤T2≤200 mA). In one embodiment, the second threshold value may be between 10 and 150 milliamps (10 mA≤T2≤150 mA). In one embodiment, the second threshold value may be between 10 and 100 milliamps (10 mA≤T2≤100 mA). In One embodiment, the second threshold value may be between 15 and 100 milliamps (15 mA≤T2≤100 mA). In one embodiment, the second threshold value may be between 20 and 50 milliamps (20 mA≤T1≤50 mA). However, the present disclosure is not limited to this.

In one embodiment, the first threshold value T1 and the second threshold value T2 may be different, but it is not limited thereto. In one embodiment, the electronic device 1 may have both the first detection mechanism and the second detection mechanism, but may also have only one of them.

The second detection mechanism may be implemented at least through the circuit structure of FIG. 5(C).

As shown in FIG. 5(C), the overcurrent protection circuit 10 may include a subtractor 11, a comparator 12, a first multiplexer 13, a second multiplexer 14, a first sampling circuit 15 and a second sampling circuit 16. The first multiplexer 13 is electrically connected to the first sampling circuit 15. The first sampling circuit 15 is electrically connected to the subtractor 11. The second multiplexer 14 is electrically connected to the second sampling circuit 16. The second sampling circuit 16 is electrically connected to the subtractor 11. The subtractor 11 is electrically connected to the comparator 12. In the following, the detection of the first timing control signal CLK1 is taken as an example.

First, the details of the first multiplexer 13 and the second multiplexer 14 will be described. In one embodiment, the first multiplexer 13 and the second multiplexer 14 each receive at least one timing control signal of the timing control signals CLK1~CLK5, and each output the first timing control signal CLK1 to the first sampling circuit 15 and second sampling circuit 16.

Next, the details of the first sampling circuit 15 and the second sampling circuit 16 will be described. In one embodiment, the first sampling circuit 15 includes a first sampler 151, a first register 152 and a second comparator 153. The second comparator 153 includes two input terminals and an output terminal, and the first sampler 151 is connected to one of the input terminals of the second comparator 153, and the first register 152 is connected to the other input terminal and the output terminal of the second comparator 153.

When the first sampling circuit 15 is in operation, the first sampler 151 performs sampling on the maximum draw current value CLK1max(S1) (such as CLK1max(t1), CLK1max(t8) and CLK1max(t15)) of the draw current of the first timing control signal CLK1 at the specific time point S1 (for example, t1, t8, or t15) in each period P1~P3, and continuously transmits the maximum current value CLK1max(S1) of each sampling to one input terminal of the second comparator 153, and the first register 152 continuously transmits a first temporary value temp1 to the other input terminal of the second comparator 153, so that the second comparator 153 continuously compares the maximum draw current value CLK1max (S1) and the first temporary value temp1. As long as the maximum draw current value CLK1max (S1) is greater than the first temporary value tempt the output terminal of the second comparator 153 will output the maximum draw current value CLK1max (S1) to the first register 152, and the first register 152 replaces the present content of the first temporary value temp1 with the maximum draw current value CLK1max (S1).

As a result, when all the sampled maximum draw current values CLK1max(S1) (for example, CLK1max(t1), CLK1max(t8) or CLK1max(t15)) are compared with the first temporary value temp1, the first temporary value temp1 in the first register 152 may form the maximum value CLK1max_max(S1) of the maximum draw current values CLK1max(S1) at the specific time point S1 in the periods P1~P3 of the first timing control signal CLK1. Then, the first register 152 may transmit the first temporary value temp1 with the maximum value CLK1max_max(S1) to the subtractor 11. In one embodiment, the initial value of the first temporary value temp1 is set to a low current value, for example, the minimum current value or a current value of 0, but it is not limited thereto.

In addition, in one embodiment, the second sampling circuit 16 includes a second sampler 161, a second register 162, and a third comparator 163. The third comparator 163 includes two input terminals and one output terminal. The second sampler 161 is connected to one of the input terminals of the third comparator 163, and the second register 162 is connected to the other input terminal and the output terminal of the second comparator 163.

When the second sampling circuit 16 is in operation, the second sampler 161 performs sampling on the maximum draw current value CLK1max(S1) (such as CLK1max(t1), CLK1max(t8) and CLK1max(t15)) of the draw current of the first timing control signal CLK1 at the specific time point S1 (for example, t1, t8, or t15) in each period P1~P3, and continuously transmits the maximum current value CLK1max(S1) of each sampling to one input terminal of the third comparator 163, and the second register 162 continuously transmits a second temporary value temp2 to the other input terminal of the third comparator 163, so that the third comparator 163 continuously compares the maximum draw current value CLK1max (S1) and the second temporary value temp2. As long as the maximum draw current value CLK1max (S1) is smaller than the second temporary value temp2, the third comparator 163 will output the maximum draw current value CLK1max (S1) to the second register 162, and the second register 162 replaces the present content of the second temporary value temp2 with the maximum draw current value CLK1max(S1). As a result, when all the sampled current values are compared with the second temporary value temp2, the second temporary value temp2 in the second register 152 can be the minimum value CLK1max_min(S1) of the maximum draw current values CLK1max(S1) at the specific time point S1 in the plurality of periods P1~P3 of the first timing control signal CLK1. Then, the second register 152 may transmit the second temporary value temp2 (i.e., CLK1max_min(S1) to the subtractor 11. In one embodiment, the initial value of the second temporary value temp2 is set to a high current value, such as the maximum draw current value CLK1max(S1) when no short circuit occurs, but it is not limited thereto.

Next, the subtractor 11 and the comparator 12 will be described. In one embodiment, the subtractor 11 may perform a subtraction on the maximum value CLK1max_max (S1) and the minimum value CLK1max_min (S1) among the draw current values of the first timing control signal CLK1 at the specific time point S1 of each period P1~P3, so as to obtain the second current difference value CLK1max_max (S1)–CLK1max_min(S1). The comparator 12 may compare the second current difference value CLK1 max_max(S1)– CLK1max_min(S1) with the second threshold value T2, so as to determine whether to perform the overcurrent protection mechanism.

For example, if the first period P1 is normal and the second period P2 has a short-circuit problem, the maximum draw current value CLK1max(t8) in the second period P2 will be higher than the maximum draw current value CLK1max(t8) in the normal time (as shown in FIG. 5(B). At this moment, with the second detection mechanism, the overcurrent protection circuit 10 can be aware of the second current difference value (for example, CLK1max(t8)– CLK1max(t1)) being greater than or equal to the second threshold value T2, so as to perform an overcurrent protection mechanism.

In addition, similar to the embodiment of FIG. 3, in one embodiment, an adder 17 may also be added to the overcurrent protection circuit 10 of the embodiment of FIG. 5.

In addition, similar to the embodiment of FIG. 4, in one embodiment of the overcurrent protection circuit 10 of FIG. 5, the first sampling circuit 15 and the second sampling circuit 16 may be replaced with a third sampling circuit 15' and a fourth sampling circuit 16' that are moved to the outside of the overcurrent protection circuit 10, and the sampled maximum value (for example, CLK1max_max (S1)) is inputted to the third multiplexer 13' and the sampled minimum value (for example, CLK1max_min(S1)) is inputted to the fourth multiplexer 14'.

In addition, in one embodiment, the electronic device 1 of the present disclosure may further perform a third detection mechanism. The third detection mechanism may be used to detect that all the lines of the timing control signals (for example, CLK1~CLK5) are short-circuited (hereinafter referred to as full short-circuit).

Please refer to FIG. 2 again, the third detection mechanism is as follows: the subtractor 11 calculates the difference value (CLK1max–CLK5, defined as the third current difference value) between the maximum draw current value of the first timing control signal CLK 1 in the second period of the electronic device 1 and the draw current value of another timing control signal (for example, the fifth timing control signal CLK5) at the same time point (for example, t8); then, the comparator 12 compares the third current difference value CLK1max–CLK5 and the maximum draw current value CLK1max of the first timing control signal CLK1; and an overcurrent protection mechanism is performed when the third current difference value CLK1max-CLK5 and the maximum draw current value CLK1max of the first timing control signal CLK1 are not equal.

In other words, when the time point is t8, the first timing control signal CLK1 corresponds to the high voltage VGH and, at this moment, the draw current value of the first timing control signal CLK1 is the maximum draw current value CLK1max. When the time point is t8, the fifth timing control signal CLK5 corresponds to the low voltage VGL. Normally, the draw current value of the fifth timing control signal CLK5 should be close to zero (or configured to be a minimum current value). Therefore, under normal conditions, the third current difference value between the draw current values of the first timing control signal CLK1 and the fifth timing control signal CLK5 at the same time point t8 can be regarded as the maximum draw current value of the first timing control signal CLK1. Conversely; in a case of full short circuit, the draw current value of the fifth timing control signal CLK5 at time point t8 will not be zero or the minimum current value. Therefore, in the case of full short circuit, the third current difference value will be smaller than the maximum draw current value of the first timing control signal CLK1.

For those skilled in the art, it can be known that the third detection mechanism can be implemented with the structure of the embodiment in FIG. 3 or the embodiment in FIG. 4 by simply modifying the inputs to the components. For example, the two input terminals of the substractor 11 are modified to be inputted with the maximum current value of the first timing control signal CLK1 during the second operation period of the electronic device 1 and inputted with the current value of the fifth timing control signal CLK5 at the same time point, and the two input terminals of the comparator 12 are modified to be inputted with the third current difference value and the maximum current value CLK1max of the first timing control signal CLK1. However, the present disclosure is not limited to this.

In one embodiment, the electronic device 1 may include at least two overcurrent protection circuits 10, one of which performs the first detection mechanism, and the other performs the third detection mechanism, but it is not limited thereto. In one embodiment, the electronic device 1 may include at least three overcurrent protection circuits 10 to perform the first detection mechanism, the second detection mechanism, and the third detection mechanism, respectively. In one embodiment, the first detection mechanism, the second detection mechanism, and the third detection mechanism may be performed by the same overcurrent protection circuit 10, as long as the detection time points of the detection mechanisms do not overlap. In one embodiment, each detection mechanism is performed during the interval between the two successive operation periods of the electronic device 1 (for example, the interval between two display frames), but it is not limited thereto.

In one embodiment, it can be used as proof of whether the object falls within the scope of the claims by comparing the presence or absence of components and connections in the electronic device 1 of the present disclosure, and it is not limited thereto.

In the present disclosure, the electronic device 1 manufactured in the aforementioned embodiments may be used in combination with a touch panel for serving as a touch device. Furthermore, if the electronic device manufactured in the aforementioned embodiments is a display device or a touch display device, it can be applied to any products known the art that require display screens, such as display devices, mobile phones, notebook computers, camcorders, cameras, music players, mobile navigation devices, TVs, car dashboards, center consoles, electronic rearview mirrors, head-up displays, etc. that need to display images.

As a result, the present disclosure provides an improved electronic device 1, which is capable of providing an overcurrent detection mechanism with a low misjudgment probability, or improving the effect of overcurrent protection.

The features of the embodiments disclosed in the present disclosure may be mixed and matched arbitrarily as long as they do not violate the spirit of the invention or conflict with each other.

The aforementioned specific embodiments should be construed as merely illustrative, and not limiting the rest of the present disclosure in any way.

What is claimed is:

1. An electronic device, comprising:
   a substrate; and
   a timing control module transmitting a plurality of timing control signals to the substrate, and including an overcurrent protection circuit for detecting a draw current value of the plurality of timing control signals, wherein the overcurrent protection circuit includes a subtractor and a comparator, and the subtractor is electrically connected to the comparator;
   wherein the plurality of timing control signals include a first timing control signal and a second timing control signal, the subtractor calculates a first current difference value between the draw current value of the second timing control signal and the draw current value of the first timing control signal, the comparator compares the first current difference value with a first threshold value, and the overcurrent protection circuit performs an overcurrent protection mechanism when the first current difference value is greater than or equal to the first threshold value.

2. The electronic device of claim 1, wherein the first threshold value is between 10 mA and 200 mA.

3. The electronic device of claim 1, wherein the overcurrent protection circuit further includes a first multiplexer and a second multiplexer which are electrically connected to the subtractor, wherein the first multiplexer receives the plurality of timing control signals and outputs the first timing control signal, and the second multiplexer receives the plurality of timing control signals and outputs the second timing control signal.

4. The electronic device of claim 3, wherein the overcurrent protection circuit further includes a first sampling circuit and a second sampling circuit, the first sampling circuit is arranged between the first multiplexer and the subtractor, the second sampling circuit is arranged between the second multiplexer and the subtractor, the first timing control signal has a maximum draw current value at a first time point on a time axis, the second timing control signal has a maximum draw current value at a second time point on the time axis, the first sampling circuit is configured to perform sampling on the draw current value of the first timing control signal from the first time point for being transmitted to the subtractor, and the second sampling circuit is configured to perform sampling on the draw current value of the second timing control signal from the second time point for being transmitted to the subtractor, where the first time point is earlier than this second time point.

5. The electronic device of claim 4, wherein the plurality of timing control signals further include another timing control signal which has a maximum draw current value at a time point after the second time point, the first multiplexer outputs the another timing control signal to the first sampling circuit, and the second multiplexer outputs the first timing control signal to the second sampling circuit.

6. The electronic device of claim 1, wherein the overcurrent protection mechanism is performed to stop the timing control module from transmitting timing control signals to the substrate.

7. The electronic device of claim 1, wherein the first timing control signal and the second timing control signal are two timing control signals adjacent in timing, and the first timing control signal is earlier than the second timing control signal in timing.

8. The electronic device of claim 7, wherein the first current difference value is obtained by subtracting a maximum draw current value the first timing control signal from a maximum draw current value of the second timing control signal.

9. The electronic device of claim 1, wherein the subtractor calculates an another current difference value between the first one of the plurality of timing control signals in timing and the last one of the plurality of timing control signals in timing, the comparator compares the another current difference value with the first threshold value, and the overcurrent protection circuit performs the overcurrent protection mechanism when the another current difference value is greater than or equal to the first threshold value.

10. The electronic device of claim 1, wherein the timing control module 4 further includes a pulse width modulator, a timing controller and a level shifter, in which the pulse width modulator is electrically connected to the timing controller, the timing controller is electrically connected to the level shifter, and the overcurrent protection circuit is arranged in the level shifter.

11. The electronic device of claim 10, wherein the pulse width modulator provides an initial voltage to the timing controller to generate the plurality of timing control signals, and the level shifter adjusts voltage levels of the timing control signals for being transmitted to the substrate and the overcurrent protection circuit.

12. The electronic device of claim 10, wherein the overcurrent protection circuit is electrically connected to at least one of the pulse width modulator and the timing controller, and when performing the overcurrent protection mechanism, the overcurrent protection circuit transmits a control signal to the pulse width modulator, the timing controller or the level shifter to stop the pulse width modulator, the timing controller or the level shifter from operation.

13. The electronic device of claim 1, wherein the overcurrent protection circuit further includes an adder arranged between the subtractor and the comparator, and the adder adds a predetermined base value to the first current difference value for being inputted to the comparator.

14. An electronic device, comprising:
a substrate; and
a timing control module transmitting a plurality of timing control signals to the substrate, and including an overcurrent protection circuit for detecting a draw current value of at least one timing control signal, wherein the overcurrent protection circuit includes a subtractor and a comparator, and the subtractor is electrically connected to the comparator;
wherein the at least one timing control signal includes a plurality of periods, the at least one timing control signal has a draw current value at a specific time point in each period and there are a maximum value and a minimum value among the draw current values, the subtractor calculates a second current difference value between the maximum value and the minimum value, the comparator compares the second current difference value with a second threshold value, and the overcurrent protection circuit performs an overcurrent protection mechanism when the second current difference value is greater than or equal to the second threshold value.

15. The electronic device of claim 14, wherein the specific time point is a time point at which the draw current value is maximum in the period.

16. The electronic device of claim 14, wherein the second threshold is between 10 mA and 200 mA.

17. The electronic device of claim 16, wherein the overcurrent protection circuit further includes a first multiplexer, a second multiplexer, a first sampling circuit and a second sampling circuit, the first multiplexer receives the at least one timing control signal and outputs the at least one timing control signal to the first sampling circuit, the first sampling circuit samples the at least one timing control signal to obtain the maximum value among the draw current values at the specific time points and transmits the maximum value to the subtractor, the second multiplexer receives the at least one timing control signal and outputs the at least one timing control signal to the second sampling circuit, and the second sampling circuit samples the at least one timing control signal to obtain the minimum value among the draw current values at the specific time points and transmits the minimum value to the subtractor.

18. The electronic device of claim 17, wherein the first sampling circuit includes a first sampler, a second comparator, and a first register, the second comparator includes two input terminals and one output terminal, the first sampler is connected to one of the input terminals of the second comparator, the first register is connected to the other input terminal and the output terminal of the second comparator, the first sampler performs sampling on the draw current value of the at least one timing control signal at the specific time point in each period and transmits the draw current value obtained in each sampling to the second comparator, the first register transmits a first temporary value to the second comparator, the second comparator compares the draw current value with the first temporary value, the output terminal outputs the draw current value to the first register when the draw current value is greater than the first temporary value, and the first register replaces present content of the first temporary value with the draw current value.

19. The electronic device of claim 17, wherein the second sampling circuit includes a second sampler, a third comparator, and a second register, the third comparator includes two inputs terminal and one output terminal, the second sampler is connected to one of the input terminals of the third comparator, the second register is connected to the other input terminal and the output terminal of the third comparator, the second sampler performs sampling on the draw current value of the at least one timing control signal at the specific time point in each period and transmits the draw current value obtained in each sampling to the third comparator, the second register transmit a second temporary value to the third comparator, the third comparator compares the draw current value with the second temporary value, the output terminal outputs the draw current value to the second register when the draw current value is smaller than the second temporary value, and the second register replaces present content of the second temporary value with the draw current value.

20. The electronic device of claim 14, wherein the overcurrent protection circuit further includes an adder arranged between the subtractor and the comparator, and the adder adds a predetermined base value to the second current difference value for being inputted to the comparator.

* * * * *